United States Patent
Lai et al.

(10) Patent No.: US 11,789,659 B2
(45) Date of Patent: Oct. 17, 2023

(54) METHOD FOR DYNAMICALLY MANAGING HOST READ OPERATION AND READ REFRESH OPERATION IN A STORAGE DEVICE, STORAGE DEVICE, AND STORAGE MEDIUM

(71) Applicant: SK hynix Inc., Icheon-si (KR)

(72) Inventors: Ching-Chung Lai, Zhubei (TW);
Lian-Chun Lee, Zhubei (TW);
Chun-Shu Chen, Zhubei (TW)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/683,898

(22) Filed: Mar. 1, 2022

(65) Prior Publication Data

US 2023/0185488 A1 Jun. 15, 2023

(30) Foreign Application Priority Data

Dec. 9, 2021 (TW) .................................. 110145996

(51) Int. Cl.
*G06F 3/06* (2006.01)

(52) U.S. Cl.
CPC ............ *G06F 3/0659* (2013.01); *G06F 3/064* (2013.01); *G06F 3/0616* (2013.01); *G06F 3/0619* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 7,099,190 B2 | 8/2006 | Noguchi et al. | |
| 9,552,171 B2 | 1/2017 | Huang et al. | |
| 10,521,287 B2 | 12/2019 | Khoueir et al. | |
| 10,622,078 B2 | 4/2020 | Norman et al. | |
| 2009/0172267 A1* | 7/2009 | Oribe ................. | G11C 16/3418 711/E12.008 |

(Continued)

FOREIGN PATENT DOCUMENTS

| | | |
|---|---|---|
| EP | 2077559 B1 | 11/2012 |
| KR | 1020120001405 A | 1/2012 |

(Continued)

*Primary Examiner* — Stephanie Wu
(74) *Attorney, Agent, or Firm* — WILLIAM PARK & ASSOCIATES LTD.

(57) ABSTRACT

A method for dynamically managing host read operation and read refresh operation in a storage device, a storage device and a storage medium thereof are provided. The method includes: controlling, by a controller of the storage device, a ratio of the number of host read operation to the number of read refresh operation in the storage device to be in line with a first value and obtaining a total read request count which accumulates in the storage device; when a criterion for updating the ratio is satisfied, determining, by the controller, a second value for the ratio of the number of host read operation to the number of read refresh operation according to the total read request count and information of blocks to be refreshed in the storage device; and controlling, by the controller, the number of host read operation and the number of read refresh operation so that a ratio of the number of host read operation to the number of read refresh operation is in line with the second value.

13 Claims, 8 Drawing Sheets

(56) References Cited

U.S. PATENT DOCUMENTS

| | | | | |
|---|---|---|---|---|
| 2010/0142276 A1* | 6/2010 | Kasuga | .................. | G11C 16/26 |
| | | | | 365/185.11 |
| 2018/0004415 A1* | 1/2018 | Lee | .................... | G11C 16/3418 |
| 2019/0189193 A1* | 6/2019 | Kim | .................... | G11C 16/3418 |
| 2019/0324689 A1* | 10/2019 | Choi | ..................... | G06F 3/0653 |
| 2021/0312976 A1* | 10/2021 | Pellizzer | ........... | G11C 11/40615 |
| 2022/0044744 A1* | 2/2022 | Wang | ..................... | G11C 16/08 |

FOREIGN PATENT DOCUMENTS

| | | |
|---|---|---|
| KR | 1020150002069 A | 1/2015 |
| WO | 2016084497 A1 | 6/2016 |

\* cited by examiner

METHOD FOR DYNAMICALLY MANAGING HOST READ OPERATION AND READ REFRESH OPERATION IN A STORAGE DEVICE, STORAGE DEVICE, AND STORAGE MEDIUM

CROSS-REFERENCE TO RELATED APPLICATION

The present application claims priority under 35 U.S.C. § 119(a) to Taiwanese Patent Application No. 110145996 filed on Dec. 9, 2021, in the Taiwan Intellectual Property Office, which is incorporated herein by reference in its entirety.

BACKGROUND OF THE INVENTION

1. Field of the Invention

The present invention relates to an electronic device, and in particular to a method for dynamically managing host read operation and read refresh operation in a storage device, a storage device, and a storage medium thereof.

2. Description of the Related Art

A non-volatile storage device can store data so that the data stored will not disappear even after power is removed, and features a power saving ability and a small volume. Therefore, the non-volatile storage device, such as a storage device based on a flash memory, is extensively applied on electronic devices. Moreover, a non-volatile storage device, such as a solid-state storage device (SSD) has also gradually become a storage device equipped in a computer system including a desktop computer, a laptop computer and a server.

An electronic device (or to be referred to as a host), when executing an application program to store various data including text, data or photos, or to play audio and video, frequently requires to make a great amount of data write or data read requests. To increase the capacity and performance of a storage device such as an SSD, the number of memory chips and the number of channels in the SSD are correspondingly increased. An SSD controller performs interleaving page read or write operations through multiple channels and memory chips by using these memory chips, hence achieving high-performance input/output operations.

However, in an actual application scenario, an SSD has physical restrictions which need to be taken into consideration during the design of an SSD controller, and corresponding measures need to be taken during page read or write operations in data processing. Thus, the efficiency of page read operations may be affected. For example, in the NAND flash memory technology, when data is read out from a flash memory device, an issue referred to as read disturbance affects memory cells. For example, when a memory cell of one word line of a block of a memory is read multiple times, neighboring memory cells of the word line in the block are affected due to electron migration, such that data stored in these neighboring memory cells may change gradually, or be referred to as being disturbed. As a result, after a period of time the block is read multiple times, the accuracy and reliability of the data stored in the block may become degraded, incurring issues of numerous error bits when the data is read, or even that these error bits cannot be restored by error correction codes (ECC). The issue above is referred to as read disturbance. To avoid read disturbance, an SSD controller is configured to perform the so-called read refresh or read reclaim operation, so as to move data in a block having a higher read count to a free block.

For example, in an application scenario in which a server provides a large number of users with online streaming media services, an SSD apparatus used by the server may experience frequent data read operations but very few data write operations. For blocks storing hot-spot data (e.g., popular videos in a server for online streaming media services), the number of read operations may quickly achieve a read refresh threshold, and a controller of the SSD apparatus then places theses blocks in a read refresh queue. When the controller of the SSD apparatus processes frequent read requests from a host, certain time needs to be allocated to process read refresh operation for these blocks in the read refresh queue. At this point in time, the read performance of the SSD apparatus may degrade drastically.

BRIEF SUMMARY OF THE INVENTION

A method for dynamically managing host read operation and read refresh operation in a storage device, a storage device and a storage medium thereof are provided according to various embodiments. Accordingly, a method for dynamically managing host read operation and read refresh operation in a storage device can be implemented, and a ratio of the number of host read operation to the number of read refresh operation in the storage device can be dynamically controlled in response to a plurality of read requests.

A method for dynamically managing host read operation and read refresh operation in a storage device is provided according to an embodiment. The method includes steps of: (a) controlling, by a controller of the storage device, a ratio of the number of host read operation to the number of read refresh operation in the storage device to be in line with a first value, and obtaining a total read request count which accumulates in the storage device: (b) when a criterion for updating the ratio is satisfied, in response to read requests of the total read request count, determining, by the controller, a second value for a ratio of the number of host read operation to the number of read refresh operation according to the total read request count and information of blocks to be refreshed in the storage device; and (c) controlling, by the controller, the number of host read operation and the number of read refresh operation in the storage device so that the ratio of the number of host read operation to the number of read refresh operation is in line with the second value.

In some embodiments, in the step (b), the blocks to be refreshed in the storage device include multiple blocks to be refreshed, and the information of the blocks to be refreshed includes a difference value between a read disturb threshold and a read count, an increased read count, and a valid page count for each of the blocks to be refreshed.

In some embodiments, for each of the blocks to be refreshed, the controller calculates a ratio of the number of host read requests and the number of pages to be moved for the one of the blocks to be refreshed according to the total read request count and the difference value between the read disturb threshold and the read count, the increased read count, and the valid page count for the one of the blocks to be refreshed during a period that the total read request count accumulates, and determines the second value according to the ratios of the numbers of the host read requests to the numbers of the pages to be moved for the blocks to be refreshed.

In some embodiments, the criterion for updating the ratio includes whether a timing value is expired.

In some embodiments, the criterion for updating the ratio includes whether the total read request count is greater than or equal to a read request threshold.

In some embodiments, the criterion for updating the ratio includes whether the information of the blocks to be refreshed in the storage device changes.

In some embodiments, in the step (c), the controller resets the total read request count and starts obtaining a total read request count which accumulates in the storage device again, and the method further includes: repeating the step (b) to update the second value, and repeating the step (c) according to the updated second value.

A storage medium is further provided according to an embodiment. The storage medium stores program instructions that are capable of causing a storage device to perform the method for dynamically managing host read operation and read refresh operation in the storage device according to any of the embodiments above.

A storage device is further provided according to an embodiment. The storage device includes a plurality of memory chips and a controller. The controller is coupled to the plurality of memory chips, and the controller is configured to perform multiple operations including: (a) controlling a ratio of the number of host read operation to the number of read refresh operation in the storage device to be in line with a first value, and obtaining a total read request count which accumulates in the storage device; (b) when a criterion for updating the ratio is satisfied, in response to read requests of the total read request count, determining a second value for a ratio of the number of host read operation to the number of read refresh operation according to the total read request count and information of blocks to be refreshed in the storage device; and (c) controlling the number of host read operation and the number of read refresh operation in the storage device so that the ratio of the number of host read operation to the number of read refresh operation is in line with the second value.

In some embodiments, in the operation (b), the blocks to be refreshed in the storage device include multiple blocks to be refreshed, and the information of the blocks to be refreshed includes a difference value between a read disturb threshold and a read count, an increased read count, and a valid page count for each of the blocks to be refreshed.

In some embodiments, for each of the blocks to be refreshed, the controller calculates a ratio of the number of host read requests and the number of pages to be moved for the one of the blocks to be refreshed according to the total read request count and the difference value between the read disturb threshold and the read count, the increased read count, and the valid page count for the one of the blocks to be refreshed during a period that the total read request count accumulates, and determines the second value according to the ratios of the numbers of the host read requests to the numbers of the pages to be moved for the blocks to be refreshed.

In some embodiments, the criterion for updating the ratio includes whether a timing value is expired.

In some embodiments, the criterion for updating the ratio includes whether the total read request count is greater than or equal to a read request threshold.

In some embodiments, the criterion for updating the ratio includes whether the information of the blocks to be refreshed in the storage device changes.

In some embodiments, in the operation (c), the controller resets the total read request count and starts obtaining a total read request count which accumulates in the storage device again, and the operations further include: repeating the operation (b) to update the second value, and repeating the operation (c) according to the updated second value.

Thus, a method for dynamically managing host read operation and read refresh operation in a storage device, a storage device and a storage medium thereof are provided according to the embodiments above. Accordingly, a method for dynamically managing host read operation and read refresh operation in a storage device can be implemented, and a ratio of the number of host read operation and the number of read refresh operation in the storage device can be dynamically controlled in response to a plurality of read requests. Therefore, the performance of a storage device in processing host read requests is improved, and at the same time the storage device is enabled to complete read refresh operation before occurrence of a read disturbance error.

DETAILED DESCRIPTION OF THE INVENTION

To fully understand the objects, features and effects of the present invention, the present invention is described in detail by way of the specific embodiments with the accompanying drawings below.

Figure 1:
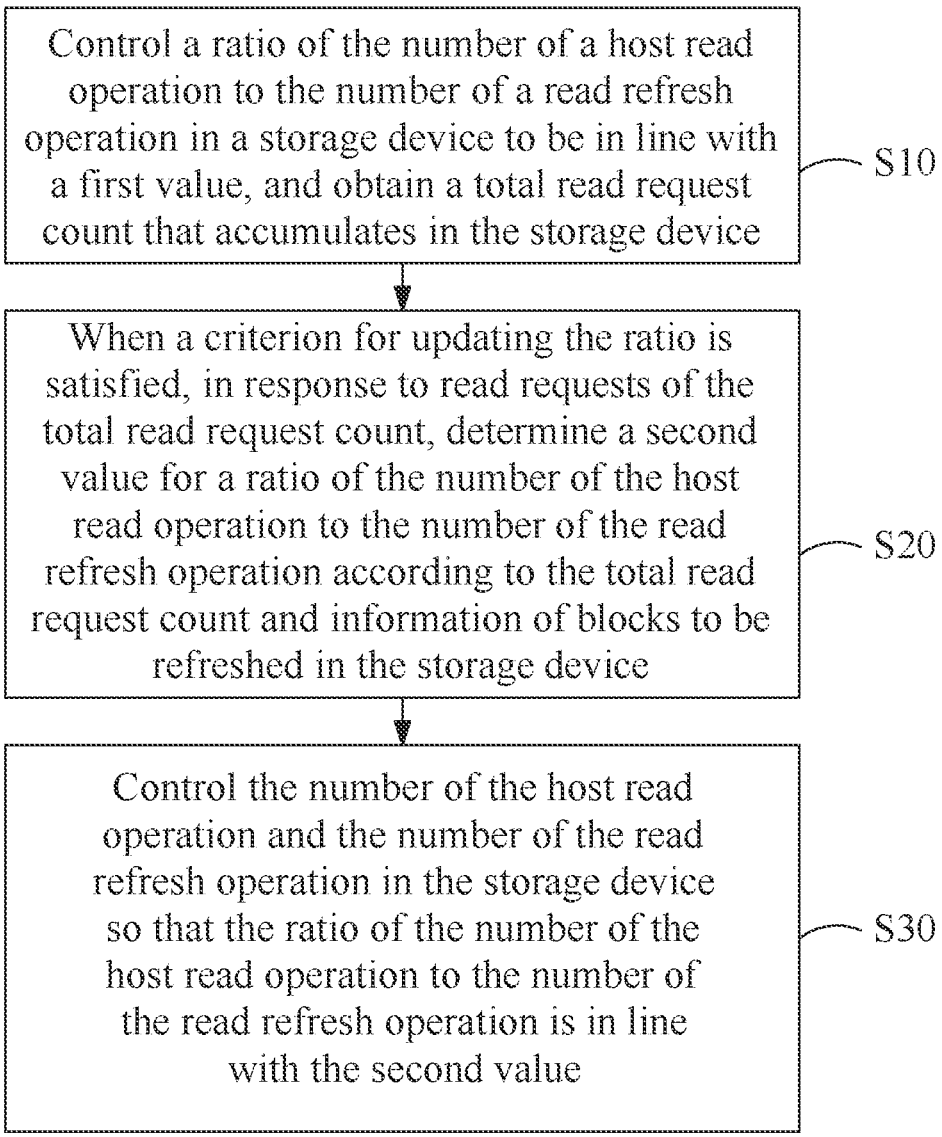
FIG. 1 is a schematic flowchart of a method for dynamically managing host read operation and read refresh operation in a storage device according to an embodiment.
Figure 2:
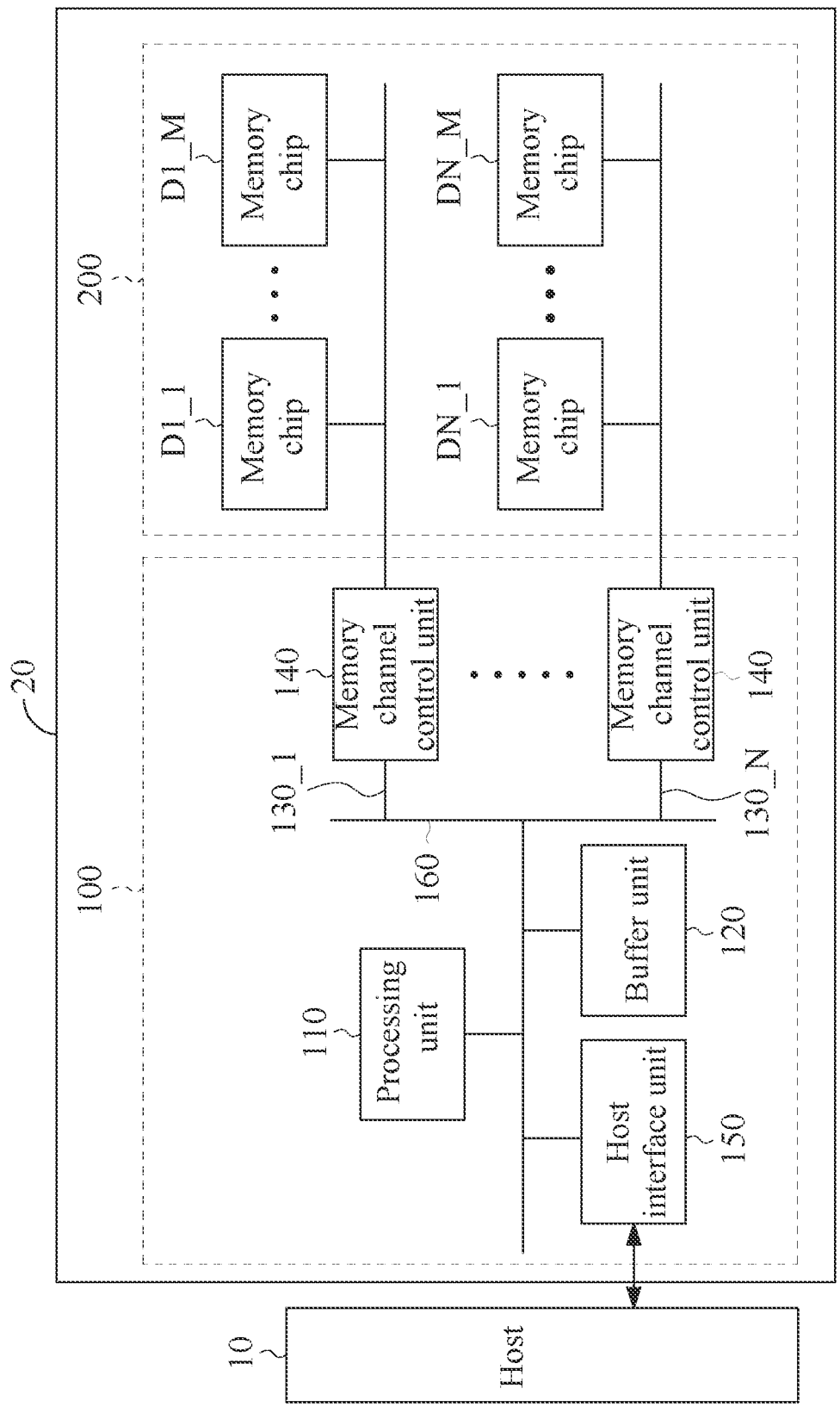
FIG. 2 is a schematic block diagram of a storage device according to an embodiment.

FIG. 1 shows a schematic flowchart of a method for dynamically managing host read operation and read refresh operation in a storage device according to an embodiment. FIG. 2 shows a storage device 20 according to an embodiment of the present invention, wherein the storage device 20 in FIG. 2 can implement the method of FIG. 1 or related embodiments. The following example related to FIG. 2 is for illustrating a suitable application scenario for implementation of the present invention. For example, in FIG. 2, a host 10 is a computing device such as a server, a mobile phone, a tablet computer and a personal computer, and the storage device 20 is, for example, a built-in or external SSD apparatus or memory unit. The host 10 reads, for example, data in the storage device 20 such as video or multimedia data and issues multiple host read requests.

As shown in FIG. 1, in one embodiment, the method includes steps S10 to S30 below. Elements in FIG. 2 are referenced as examples for assisted description: however, the implementation of the method is not limited by the examples.

As shown in the step S10, a controller (e.g., 100 in FIG. 2) of a storage device (e.g., 20 in FIG. 2) controls a ratio of the number of host read operation to the number of read refresh operation in the storage device to be in line with a first value, and obtains a total read request count which accumulates in the storage device. The first value is, for example, an initial value.

As shown in the step S20, when a criterion for updating the ratio is satisfied, in response to read requests of the total read request count, the controller determines a second value for the ratio of the number of host read operation to the number of read refresh operation according to the total read request count and information of blocks to be refreshed in the storage device.

As shown in the step S30, the controller controls the number of host read operation and the number of read refresh operation in the storage device so that the ratio of the number of host read operation to the number of read refresh operation is in line with the second value.

Based on the method in FIG. 1, multiple approaches for dynamically managing host read operation and read refresh operation in a storage device can be implemented, and a ratio of the number of host read operation to the number of read refresh operation in the storage device can be dynamically controlled in response to a plurality of read requests of the total read request count that accumulates and is obtained during a period of time.

According to some embodiments of the method in FIG. 1, in the step S30, the controller resets the total read request count and starts obtaining the total read request count which accumulates in the storage device again, and the method further includes: repeating the step S20 to update the second value, and repeating the step S30 according to the updated second value. Thus, during the operation of the storage device, the second value is dynamically and repeatedly updated, enabling the controller to make corresponding adjustments on the ratio of the number of host read operation to the number of read refresh operation in the storage device in response to host read requests from the host (e.g., 10 in FIG. 2).

Therefore, the embodiments based on the method in FIG. 1 is capable of improving the performance of a storage device in processing host read requests, and at the same time allowing the storage device to complete read refresh operation before occurrence of a read disturbance error. The method of FIG. 1 may be further configured or determined according to requirements.

Based on the method of FIG. 1, the timing for dynamically updating the second value can be flexibly configured by using a criterion for updating the ratio. The criterion for updating may include one or more standards for determination.

For example, in some embodiments, the criterion for updating the ratio includes whether a timing value is expired. For example, a counter is implemented in the controller, and when a count of the counter reaches a time threshold, the controller updates the second value according to the step S20.

In some embodiments, the criterion for updating the ratio includes whether the total read request count is greater than or equal to a read request threshold. For example, a register is implemented in the controller to accumulate the total read request count in the storage device, and when the total read request count reaches the read request threshold, the controller updates the second value according to the step S20.

In some embodiments, the criterion for updating the ratio includes whether the information of the blocks to be refreshed in the storage device changes.

For example, a read refresh block queue is implemented in the controller, and the controller records a read count of each block of a memory (e.g., 200 in FIG. 2) of the storage device. For example, when the read count of one block in the memory is greater than a read refresh threshold of the block, the block can be set as a block to be read refreshed and be placed in the read refresh block queue, so as to wait for read refresh operation scheduled and performed by the controller. In the presence of a change in the read refresh block queue, if a new block is placed into the read refresh block queue or there is a change in information of blocks in the read refresh block queue, one or more of the situations above can be set as a change in the information of the blocks to be refreshed, and thus the controller updates the second value according to the step S20.

In some embodiments, in the step S20, the blocks to be refreshed in the storage device include multiple blocks to be refreshed, and the information of the blocks to be refreshed includes a difference value between a read disturb threshold and a read count, an increased read count, and a valid page count for each of the blocks to be refreshed.

In some embodiments, in the step S20, for each of the blocks to be refreshed, the controller calculates a ratio of the number of host read requests to the number of pages to be moved for the one of the blocks to be refreshed according to the total read request count and according to, during a period that the total read request count accumulates, the difference value between the read disturb threshold and the read count, the increased read count, and the valid page count for the one of the blocks to be refreshed, and determines the second value according to the ratios of the numbers of host read requests to the numbers of pages to be moved for the blocks to be refreshed.

Thus, according to the above embodiments with respect to the step S20, various appropriate approaches for calculating the ratio can be configured to make corresponding adjustments on the ratio of the number of host read operation to the number of read refresh operation in the storage device in response to host read requests from the host (e.g., 10 in FIG. 2). Exemplary embodiments are to be described in detail to illustrate the calculation for the ratio hereinafter.

Further examples are given below for illustrating various implementation approaches according to the method in FIG. 1 above.

Figure 3:
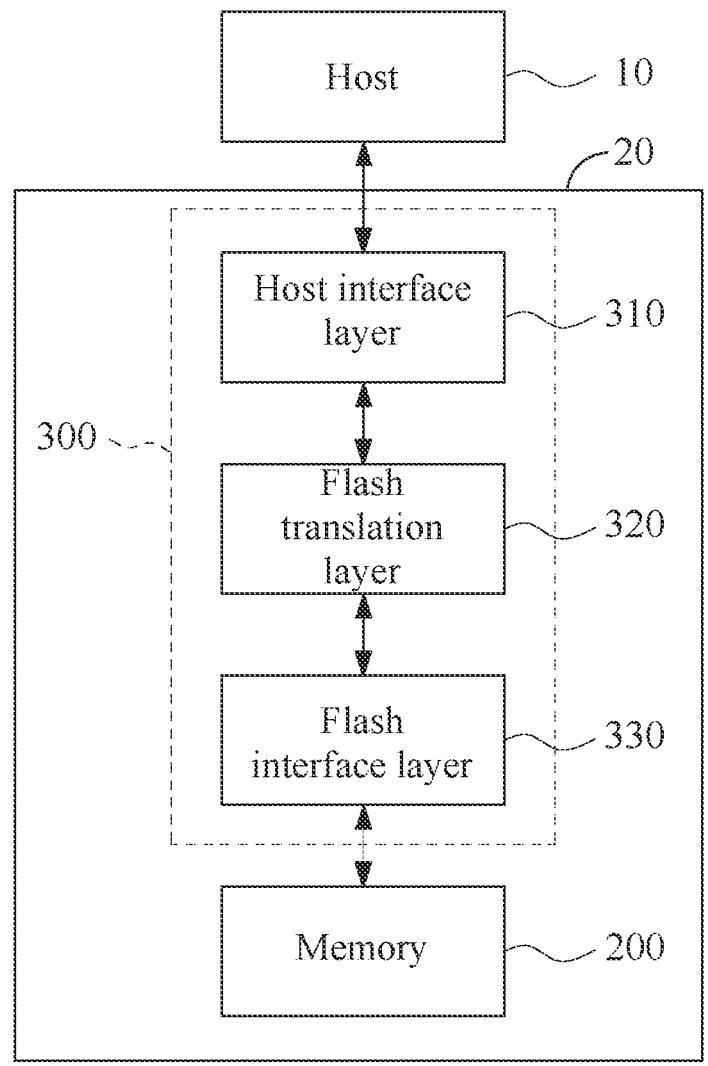
FIG. 3 is a schematic block diagram of a controller according to an embodiment.

FIG. 2 shows a storage device according to an embodiment of the present invention. The storage device in FIG. 2 may be used to implement the method for dynamically managing host read operation and read refresh operation in a storage device or associated embodiments. The examples related to FIG. 2 and FIG. 3 are for illustrating a suitable application scenario for implementation of the present invention; however, the implementation of the present invention is not limited to these examples.

As shown in FIG. 2, the storage device 20 includes a controller 100 and a memory 200. The controller 100 includes a processing unit 110, a buffer unit 120, a plurality of memory channels 130_1 to 130_N (where N is an integer greater than 1, for example) and corresponding memory channel control units 140. The buffer unit 120 may be implemented by a volatile memory or a non-volatile memory. The memory 200 includes a plurality of memory chips D1_1 to D1_M to DN_1 to DN_M (where N and M are integers greater than 1, for example). For example, the memory chips are flash memories, such as NOR memories or NAND memories; however, the implementation of the present invention is not limited to these examples. The memory 200 provides multiple physical addresses for storage and may be divided into multiple blocks as needed, each of which includes multiple pages. The storage device 20 uses a page as a data unit for reading or writing data.

The controller 100 can receive a read request or a write request from the host 10 by way of communicating with the host 10 through a host interface unit 150. The controller 100 generates a corresponding read command or write command corresponding to the host read request or the host write request, and sends the corresponding command generated to a memory channel control unit 140 of the corresponding memory channel (e.g., 130_1 to 130_N). The memory channel control unit 140 is for controlling at least one memory chip. For example, the memory channel control unit 140 sends the data read command to a memory chip and accordingly sends read data to the controller 100, for example, to the buffer unit 120. The controller 100 sends the data requested by the host 10 to the host 10. For another example, the memory channel control unit 140 writes data to be written to the memory chip according to a data write command. When the controller 100 controls the operation of the memory 200, the buffer unit 120 may store data for various operations used by the controller 100 and the memory 200, such as read, write, programming and erase operations. In FIG. 2, the plurality of memory channel control units 140 perform read or write operations in parallel. Moreover, the processing unit 110 may be electrically coupled to memory channels (e.g., 130_1 to 130_N) through a bus 160. However, the implementation of the present invention is not limited to the examples above. For example, each of the memory channel control units can be implemented by a logic circuit or a programmable circuit, or be implemented in the form of software and be executed by the processing unit 110.

The host interface unit 150 can process commands and data provided from the host 10, and can communicate with the host 10 by at least one of various interface protocols including Universal Serial Bus (USB), Multimedia Card (MMC), Peripheral Component Interconnect Express (PCI-E), Serial Attached SCSI (SAS), Serial Advanced Technology Attachment (SATA), Parallel Advanced Technology Attachment (PATA), Small Computer System Interface (SCSI), Enhanced Small Disk Interface (ESDI) and Integrated Drive Electronics (IDE), Advanced Host Controller Interface (AHCI) and Non-Volatile Memory express (NVMe).

Referring to both FIGS. 2 and 3, FIG. 3 shows a schematic block diagram of a controller according to an embodiment. FIG. 2 depicts a controller 300 with architecture implemented by way of firmware or software. For example, the controller 300 includes a host interface layer 310, a flash translation layer 320 and a flash interface layer 330. The host interface layer 310 is for communicating with the host 10 and serves as an interface between the host 10 and the controller 300. The flash translation layer 320 is for managing read, write and erase operations. The flash translation layer 320 further converts a logical address (e.g., a logical block address or a logical page address) to a physical address (e.g., a physical block address or a physical page address) corresponding to a memory chip (e.g., D1_I to D1_M to DN_1 to DN_M) of the memory 200. The flash interface layer 330 is for processing communication between the flash translation layer 320 and the memory 200, for example, sending a command from the flash translation layer 320 to the memory 200.

The controller 300 in FIG. 3 can be implemented by the hardware architecture in FIG. 2. The flash translation layer 320 needs to refer to and maintain an address mapping table when converting a logical address to a physical address. Due to a large amount of data of an address mapping table, the flash translation layer 320 stores a partial section of the address mapping table in a cache. When the cache lacks correspondence between logical addresses and physical addresses needed for the conversion, the flash translation layer 320 updates contents of the section of the address mapping table in the cache, and generates a mapping table read command. Moreover, in application scenarios of some memory products, such as embedded multimedia card (eMMC) or other memory products, the address mapping table is stored in a memory of the memory product; however, the present invention is not limited to the examples above.

The controller 300 controls various operations of the memory 200, for example, write, read, programming and erase operations. For example, the controller may generate a write command in response to a write request of the host 10, and execute the write command generated. The controller may store host write commands using a command queue. The controller may sequentially process the host write commands stored in the command queue so as to perform a data write operation.

Moreover, the controller 300 may further control a firmware algorithm used for the flash translation layer 320. For example, the controller 300 may realize algorithms including garbage collection (GC), wear-leveling (WL), block reclaim (BR) and runtime bad block (RBB).

In a read disturbance defense operation, the controller 300 can be configured for recording the read count of each block. For example, when one page of a block is read once, the controller 300 increases the read count by 1. If the read count of one block is greater than the read refresh threshold of the block, the block can be placed in a read refresh block queue, in order for the controller 300 to schedule and perform read refresh operation. Data of the blocks in a read refresh block queue should be moved to a free block before the read count reaches a read disturb threshold, wherein reaching of the read disturb threshold implies a situation where error correction codes (ECC) may not be able to restore error bits. Moreover, the read disturb threshold and the read refresh threshold of each block may be different from those of another due to differences in such as a block erase period and the number of blocks in the read refresh block queue.

FIGS. 2 and 3 depict suitable application scenarios for implementation of the present invention: certainly, the implementation of the present invention is not limited to these examples. In an actual application scenario, a host may execute one or more applications or execute service programs, and these programs may issue a large number of data read requests simultaneously or at close time instants, and these data read requests are irregularly transmitted like random data to a storage device (such as an SSD).

Figure 4:
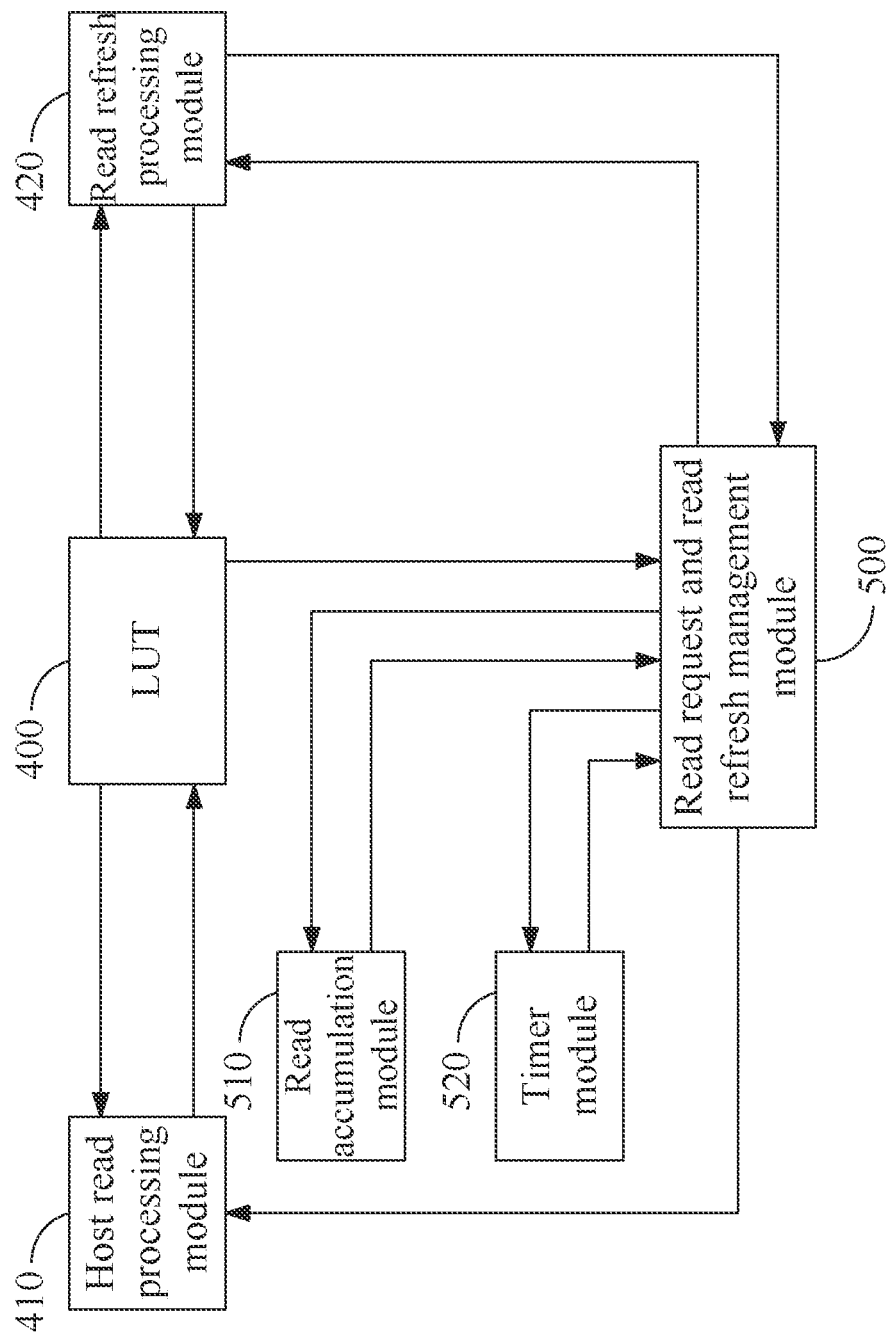
FIG. 4 is a schematic architecture diagram illustrating an embodiment of a controller implemented according to the method in FIG. 1.

FIG. 4 shows a schematic architecture diagram of an embodiment of a controller implemented according to the method in FIG. 1. According to the method in FIG. 1, a controller (e.g., 100 in FIG. 2 or 300 in FIG. 3) can be configured to have the architecture shown in FIG. 4.

In FIG. 4, a read request and read refresh management module 500 can be implemented according to the method in FIG. 1 to control the number of host read operation and the number of read refresh operation in the storage device, so that a ratio of the number of host read operation to the number of read refresh operation is in line with a value. Moreover, the read request and read refresh management module 500 is further in charge of calculation for a value for updating the ratio. The read request and read refresh management module 500 can be configured to obtain information about host read requests or information about read refresh blocks from one or more look-up tables (LUT) 400 (e.g., including the address mapping table as mentioned above) implemented in the flash translation layer 320 of a controller (100 in FIG. 2 or 300 in FIG. 3). The read request and read refresh management module 500 can also be configured to obtain information about read refresh blocks from a read refresh processing module 420.

Moreover, a read accumulation module 510 is configured to obtain the total read request count that accumulates in the storage device 20. For example, the read request and read refresh management module 500 can be configured to perform various operations on the read accumulation module 510, for example, an operation for obtaining the total read request count, an operation for triggering the read accumulation module 510 to accumulate read requests, or an operation for resetting the total read request count of the read accumulation module 510. Accordingly, the read request and read refresh management module 500 and the read accumulation module 510 can be configured to be implemented according to the steps S10 to S30 in FIG. 1. For example, when the read request and read refresh management module 500 controls a ratio of the number of host read operation to the number of read refresh operation in the storage device to be in line with a value (e.g., the step S10 or S30), it can trigger the read accumulation module 510 so as to obtain the total read request count that accumulates in the storage device. When a criterion for updating the ratio is satisfied (e.g., the step S20), the read request and read refresh management module 500 can obtain the total read request count from the read accumulation module 510 so as to calculate a value for updating the ratio. When the read request and read refresh management module 500 has updated the value of the ratio and performed control (e.g., the step S30) accordingly, the read accumulation module 510 may be reset and again triggered so as to restart the accumulation of the total read request count.

Moreover, in one embodiment, the controller of the storage device is also provided with a timer module 520 for timing, and triggers the read request and read refresh management module 500 to update the ratio when a timing value has reached a time threshold.

Moreover, in FIG. 4, a host read processing module 410 is for performing a corresponding read operation in response to a host read request. A read refresh processing module 420 is for performing a process corresponding to the reading and refreshing so as to complete the read refresh operation. The host read processing module 410 and the read refresh processing module 420 may be both configured to convert a read logical address (e.g., a logical block address or a logical page address) to a physical address (e.g., a physical block address or a physical page address) by looking up the address mapping table in the foregoing LUT 400.

Moreover, the read refresh processing module 420 can be configured to request the controller for an update of the block read count after performing the corresponding read operation so as to update the foregoing LUT 400.

The read refresh processing module 420 can be configured to implement a read refresh block queue (RRBQ). The read refresh processing module 420 can be configured to obtain the block read count and the read disturb threshold and information associated with read refresh by looking up the foregoing LUT 400 and accordingly detect situations of read disturbances of individual blocks. In addition, the read refresh processing module 420 detects the situations of read disturbances of individual blocks, performs processing associated with the read refresh and moves the blocks according to the situations, and after the processing, updates information associated with the mapping relationship of related block addresses, the block read count and valid page calculation. The read refresh processing module 420 can be configured to send information associated with updating of the mapping relationship of related block addresses, the block read count and the valid page calculation to the controller so as to update the foregoing LUT 400.

According to the steps S10 and S20, a controller (e.g., 100 in FIG. 2) of the storage device (e.g., 20 in FIG. 2) for controlling the ratio of the number of host read operation to the number of read refresh operation in the storage device to be in line with a value (e.g., the first value, the second value or the updated second value) may be achieved by various implementation approaches.

In one embodiment, the host read processing module 410 can be configured to perform the host read operation only when authorization is obtained from the controller each time before the read operation is to be performed. That is, the host read processing module 410 may first make a request to the controller, and is allowed to perform a host read operation only after obtaining the authorization returned from the controller, wherein the controller determines whether to issue the authorization according to the ratio in the step S10 or S30.

In another embodiment, the host read processing module 410 can be configured to request for authorization and obtain a quota of number of times for performing read operation from the controller. If the quota assigned to the host read processing module 410 by the controller according to the ratio in the step S10 or S30 is a first number, when the number of times of read operation performed by the host read processing module 410 has reached the quota, the host read processing module 410 needs to again request for authorization and obtain a new quota of times for performing read operation from the controller. The authorization and the quota may be realized by the read request and read refresh management module 500.

On the other hand, in one embodiment, the read refresh processing module 420 can be configured to perform read refresh operation only when authorization is obtained from the controller each time before the read refresh operation is to be performed. That is, the read refresh processing module 420 may first make a request to the controller, and is allowed to perform read refresh operation only after obtaining the authorization returned from the controller, wherein the controller determines whether to issue the authorization according to the ratio in the step S10 or S30.

In another embodiment, the read refresh processing module 420 can be configured to request for authorization and obtain a quota of number of times for performing read refresh operation from the controller. If the quota assigned to the read refresh processing module 420 by the controller according to the ratio in the step S10 or S30 is a second number, when the number of times of read refresh operation performed by the read refresh processing module 420 has reached the quota, authorization needs to be requested and a new quota of times for performing read refresh operation needs to be obtained from the controller.

The authorization and assignment of the quota in the embodiments above may be implemented by the read request and read refresh management module 500, or may be implemented by a control module or other modules provided in the controller.

Embodiments of calculating a value of the ratio for controlling the number of host read operation and the number of read refresh operation in the storage device in the step S20 is to be described below.

In an application scenario where the host 10 is a server, the storage device 20 may experience frequent data read operations but very few data write operations. For blocks storing hot-spot data (e.g., popular videos in a server for online streaming media services), the number of read operations may quickly reach a read refresh threshold, and the controller 100 of the storage device 20 then places theses blocks to a read refresh queue. When the controller 100 of the storage device 20 processes frequent read requests from a host, the storage device 20 needs to allocate certain time to process read refresh operation for these blocks in the read refresh queue. At this point in time, the read performance of the storage device 20 may degrade drastically.

Figure 5A:
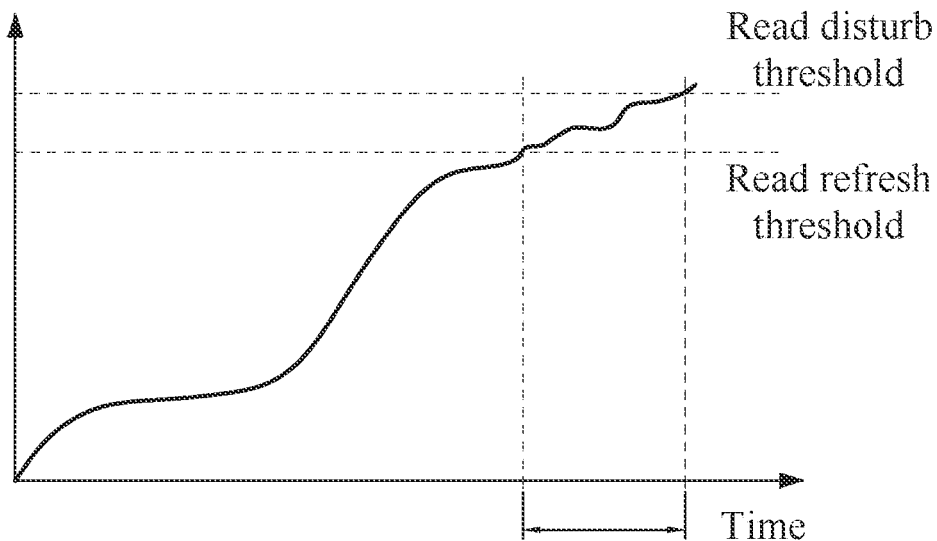
FIG. 5A is a schematic diagram illustrating the change of read request and read refresh of a block over time.
Figure 5B:
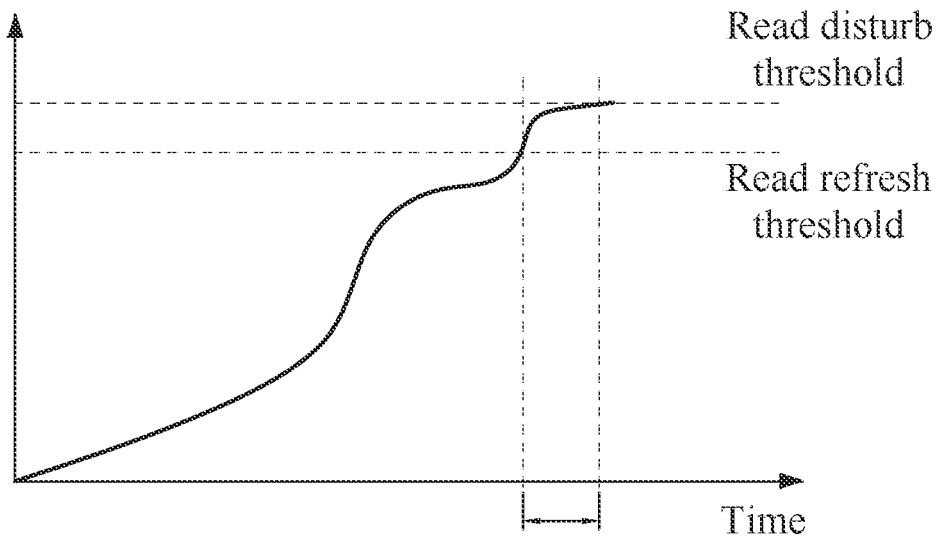
FIG. 5B is a schematic diagram illustrating the change of read request and read refresh of another block over time.

FIG. 5A shows a schematic diagram illustrating the change of read request and read refresh of a block A over time. FIG. 5B shows a schematic diagram illustrating the change of read request and read refresh of another block B over time. As shown in FIGS. 5A and 5B, compared to the block B, the increase in the read count of the block A is moderate, and a longer period exists from the instant at which the read count of the block A has reached the read refresh threshold to the instant of having reached the read disturb threshold. In contrast, the change in the read count of the block B is greater by sometimes increasing quickly and sometimes increasing slowly, and a shorter period exists from the instant at which the read count of the block B has reached the read refresh threshold to the instant of having reached the read disturb threshold. Hence, it is not easy to continuously calculate an optimal (or adaptive) ratio as time passes. During a period in which the controller of the storage device also processes the host read request, the read refresh operation needs to be performed simultaneously on many blocks to be refreshed, while new blocks that need to perform read refresh operation may be arisen at any time. In addition, the rate of increased read count (that is, reading behaviors) of each block to be refreshed changes over time, for example, as shown in FIG. 5A and FIG. 5B. Moreover, each block to be refreshed has a valid page count and a read refresh threshold that are different from those of another, and this affects the time required to complete the read refresh operation.

In order to resolve the possible drastic degradation in read performance during the read refresh operation, an approach for managing or adjusting a ratio of host read requests to internal block data moves is described in the embodiment below. The ratio can be set to maintain as stable and high read performance as possible, and can complete read refresh operation before any possible read disturbance error occurs (that is, when the block read count reaches the read disturb threshold).

In some embodiments, a value of the ratio for processing the host read requests and the read refresh block page moves is determined according to information of blocks in the read refresh block queue (RRBQ), for example, an increased read count (IRC), a valid page count (VPC) needed to be moved, and a read disturb threshold (RDT) within a period. An optimal M:1 ratio can be further calculated according to the information above, as the second value in the step S20 and S30 of the method based on FIG. 1. According to the second value (or regarded as a target value) of this ratio, for example, the controller can control or allow services for M host read requests and one block page move within each period, or N host read requests and N/M block page moves within one period. For example, according to the step S30 of the method based on FIG. 1, the controller controls the number of host read operation and the number of read refresh operation in the storage device so that a ratio of the number of host read operation to the number of read refresh operation is in line with M:1.

Figure 6:
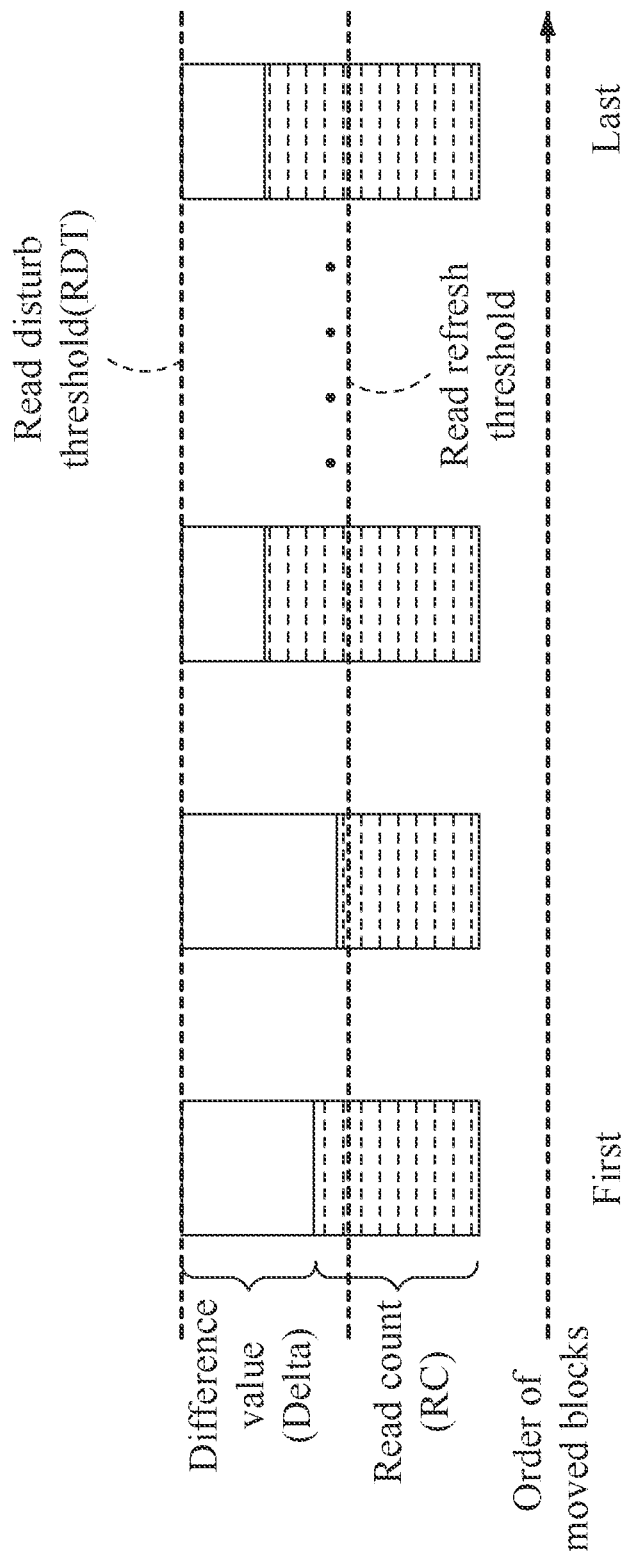
FIG. 6 is a schematic diagram illustrating an embodiment about a read refresh block queue.
Figure 7:
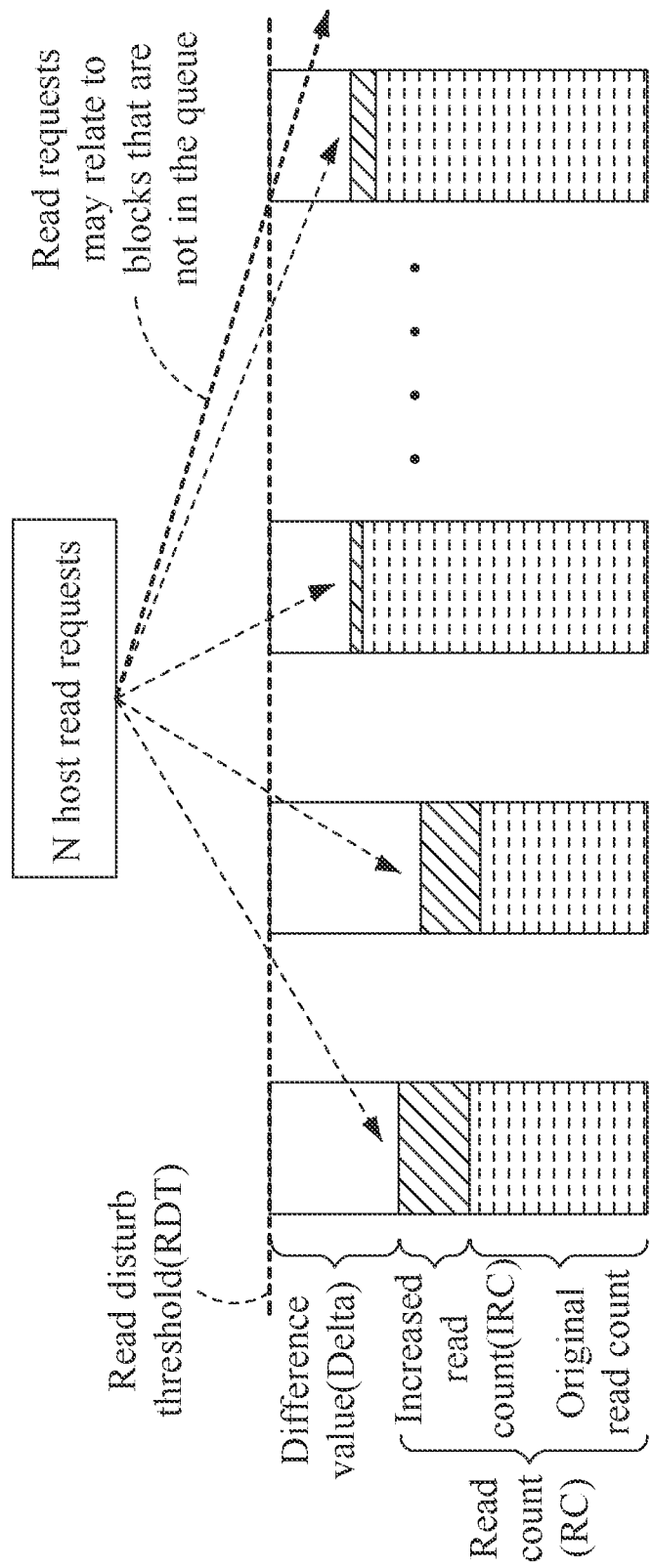
FIG. 7 is a schematic diagram illustrating another embodiment about a read refresh block queue.

Before setting forth an embodiment for calculating an optimal ratio, an example associated with a read refresh block queue is described below. In the presence of multiple blocks in the read refresh block queue, a controller (e.g., 100 in FIG. 2 or 300 in FIG. 3) of a storage device or a flash translation layer (e.g., 320 in FIG. 3) performs the read refresh operation on these blocks in order, for example, as indicated by the dashed arrow in FIG. 6. The controller or the flash translation layer determines the order according to such as first-in-first-out (FIFO), a block read count and a block valid page count. After a period of time, the host read request (e.g., there are N host read requests) and the increased read count (IRC) of each block may be different from those of another, as shown in FIG. 7.

An example of a calculation process for an optimal ratio of the host read requests to the read refresh block page moves is described below.

1. Information of the blocks, including: (1) a difference value (delta) of the blocks, (2) an increased read count (IRC) and (3) a valid page count (VPC), is obtained from the read refresh block queue (RRBQ).

(1) The difference value (delta) is a difference value between the read disturb threshold (RDT) and the read count (RC) corresponding to each block in the read refresh block queue (RRBQ), and is expressed by, for example, the equation below:

$$\text{Delta}_i = \text{RDT}_i - \text{RC}_i,$$

where the number of blocks in the read refresh block queue (RRBQ) is k, and $\text{RDT}_i$, $\text{RC}_i$ and $\text{Delta}_i$ respectively represent the read disturb threshold, the read count and the difference between the two with respect to a block i, where i is an integer between 1 to k.

(2) The increased read count (IRC) is a corresponding increased read count of each block during N host read requests. Moreover, the read count $\text{RC}_i$ of the block i can also be a sum of an original read count and the increased read count (e.g., denoted as $\text{IRC}_i$).

(3) The valid page count (VPC) is the corresponding valid page count of each block.

2. It is assumed that every N host read requests will increase the increased read count of the block i, which is represented by $\text{IRC}_i$. Thus, before read disturbance occurs, for the block i, "the number of acceptable host read requests" can be estimated as:

$$\text{AcptHostRd}_i = (\text{Delta}_i / \text{IRC}_i) * N.$$

For the block i, when the number of the increased host read requests is $\text{AcptHostRd}_i$, the read count of the block i is caused to reach the read disturb threshold (RDT).

3. For each block in the read refresh block queue (RRBQ) in FIG. 7, it is further determined for the block i that, the accumulation of valid page counts from the block I to the block i is represented by $\text{MVPC}_i$, by the equation below, for example:

$$\text{MVPC}_i = \text{VPC}_1 + \ldots + \text{VPC}_i.$$

$\text{MVPC}_i$ can represent the number of pages that need to be moved for completing the read refresh operations for the block I to the block i in the read refresh block queue (RRBQ).

4. For each block, the ratio of the number of host read requests to the number of pages that need to be moved is calculated, for example, the ratio HostRdPerMv$_i$ of the block i is obtained by dividing AcptHostRd$_i$ by MVPC$_i$, as the equation below:

HostRdPerMv$_i$=AcptHostRd$_i$/MVPC$_i$

It is assumed that the read count of the block i will reach the read disturb threshold (RDT) after AcptHostRd$_i$ host read requests, and the read refresh operation for the block i will be completed after moving MVPC$_i$ block pages. Thus, the number of host read requests processed can be maximized by using HostRdPerMv$_i$ as the ratio, and the read refresh operation of the block i can be completed before read disturbance error occurs.

5. By using HostRdPerMv$_i$ as the ratio, the number of the host read requests processed can be maximized and read disturbance error can be avoided for the block i, but might not for other blocks. Thus, in one embodiment, a minimum value is selected from HostRdPerMv$_i$ to HostRdPerMv$_k$ as the optimal ratio M so as to satisfy all blocks. For example, an equation for obtaining an optimal ratio of the host read requests to the block page moves can be represented as:

$$M = Min\{HostRdPerMv_i\} = Min\left\{\frac{Delta_i * N}{IRC_i * (VPC_1 + \ldots + VPC_i)}\right\},$$

$i = 1 \sim k$, where, $HostRdPerMv_i = \frac{AcptHostRd_i}{MVPC_i} = \frac{Delta_i * N}{IRC_i * (VPC_1 + \ldots + VPC_i)}$.

Figure 8:
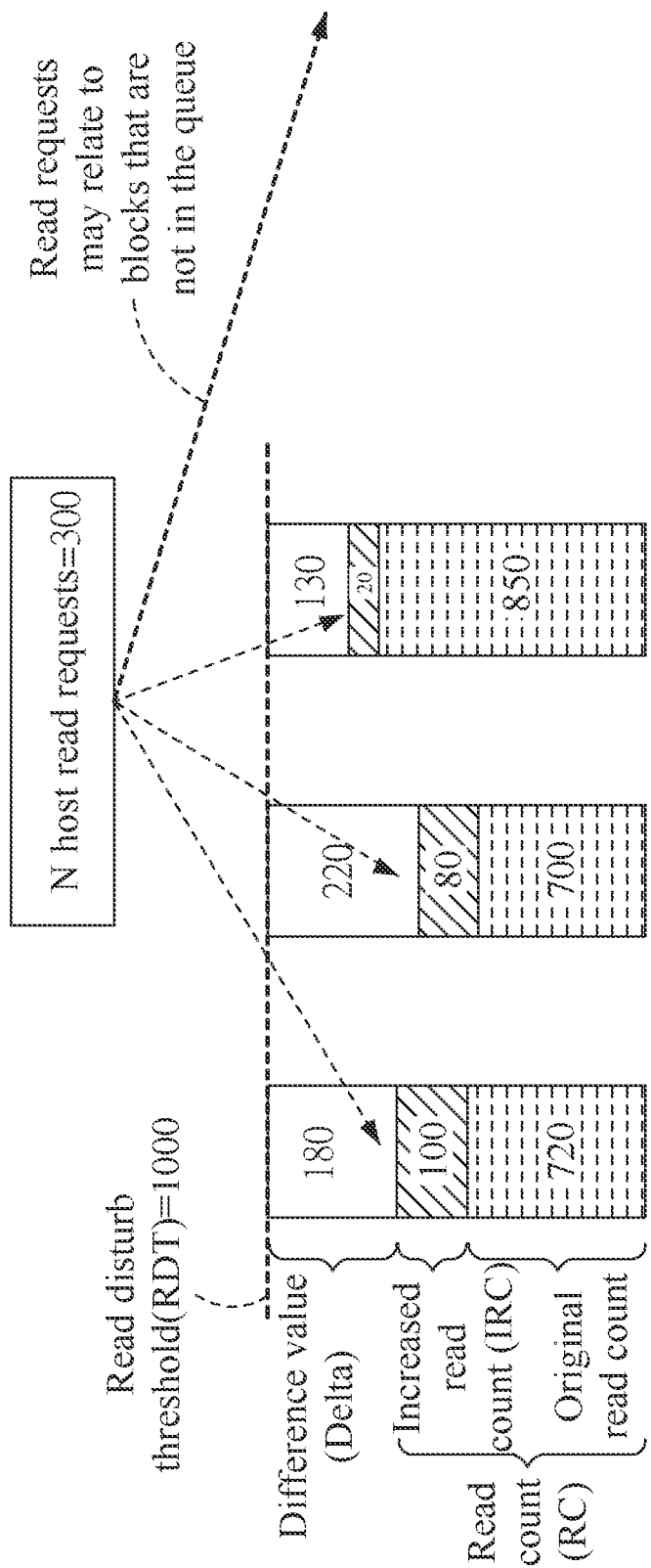
FIG. 8 is a schematic diagram illustrating an embodiment of calculation of updating the value of a ratio controlled by step S20.

As shown in FIG. 8, in one example, the read refresh block queue (RRBQ) includes three blocks, the read disturb thresholds of these blocks are all 1000, and the read counts are respectively 720, 700 and 850. After a period of time, 300 more host read requests are received, and the read counts of the three blocks are respectively changed to 820, 780 and 870 (i.e., the increased read counts are respectively 100, 80 and 20). As shown in TABLE 1, according to the information above, the optimal ratio M of the host read requests to the block page moves is 11. Therefore, according to the optimal ratio M=11, in the next period, 11 host read requests and one block page move are processed in each period, or a total of 500 host read requests and 45 block page moves are processed.

shown in FIG. 2) and a controller (e.g., the controller 100 in FIG. 2 or 300 in FIG. 3). The controller is coupled to the plurality of memory chips through multiple memory channels, wherein the controller is configured to perform a plurality of operations including the operations corresponding to the steps S10 to S30 of the method in FIG. 1. In some embodiments, the storage device can be further configured to be programmed to implement at least one or a combination of the plurality of embodiments based on the method in FIG. 1. The storage device may be implemented as a solid-state storage device (SSD), a universal flash storage (UFS), an embedded multimedia card (eMMC), or any other appropriate storage device or a product based on a storage device.

Moreover, in the embodiments (e.g., FIG. 2 and FIG. 3) associated with a storage device, at least one or a combination of the processing unit 110, the memory channel control unit 140 and the host interface unit 150 may be implemented by one or more circuits, for example, a microprocessor, a processor, or a digital signal processor. Alternatively, the units above may be designed based on Hardware Description Language (HDL) or techniques of other design means of digital circuits generally known to a person skilled in the art, and may be implemented by one or more of circuits based on a field programmable gate array (FPGA), an application-specific integrated circuit (ASIC) or a complex programmable logic device (CPLD), or be implemented by a dedicated circuit or module. In addition, the memory channel control unit may be implemented in the form of software such as a process, thread, program module or other software approaches. However, the implementation of the present invention is not limited to the examples above. Moreover, the steps S10 to S30 in FIG. 1 may be implemented by a logic circuit or other appropriate digital circuits.

Further, in some embodiments, a non-transient storage medium is provided. The non-transient storage medium stores program instructions that are capable of causing a computing device (e.g., the storage device shown in FIG. 2 or FIG. 3) to perform the method for dynamically managing host read operation and read refresh operation in the storage device, wherein the method includes any or a combination of the embodiments of the method in FIG. 3. For example, the program instructions are one or more programs or program modules and are for performing the steps S10 to S30 in FIG. 1, and the program instructions of these modules

TABLE 1

|  | Block 1 | Block 2 | Block 3 |
|---|---|---|---|
| Difference value Delta$_i$ | 180 | 220 | 130 |
| Increased read count IRC$_i$ | 100 | 80 | 20 |
| Valid page count VPC$_i$ | 10 | 60 | 25 |
| Number of acceptable host read requests AcptHostRd$_i$ | (180/100)*300 = 540 | (220/80)*300 = 825 | (130/20)*300 = 1950 |
| Number of pages that need to be moved for completing read refresh operation: MVPC$_i$ | 10 | 10 + 60 = 70 | 10 + 60 + 25 = 95 |
| Ratio of host read requests to block page moves: HostRdPerMv$_i$ | 540/10 = 54 | 825/70 = 11 | 1950/20 = 20 |
| M |  | Min{54, 11, 20} = 11 |  |

In some embodiments, a storage device is provided including a plurality of memory chips (e.g., the memory 200 operate in collaboration or may be executed in any appropriate order or be executed in parallel. When the computing device executes the program instructions, the computing device is caused to perform the method for dynamically managing host read operation and read refresh operation in the storage device based on FIG. 1 according to an embodiment. The readable storage medium above may be firmware, a ROM, a RAM, a memory card, an optical information storage medium, a magnetic information storage medium, or any other types of storage media or memories; however, the implementation of the present invention is not limited to the examples above.

Thus, a method for dynamically managing host read operation and read refresh operation in a storage device, a storage device and a storage medium thereof are provided according to the embodiments above. Accordingly, a method for dynamically managing host read operation and read refresh operation in a storage device can be implemented, and a ratio of the number of host read operation and the number of read refresh operation in the storage device can be dynamically controlled in response to a plurality of read requests. Therefore, the performance of a storage device in processing host read requests can be improved, and at the same time the storage device is enabled to complete read refresh operation before read disturbance error occurs.

The present invention is described by way of the preferred embodiments above. A person skilled in the art should understand that, these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of legal protection of the present invention should be defined by the appended claims.

What is claimed is:

1. A method for dynamically managing host read operation and read refresh operation in a storage device, the method comprising steps of:
   (a) controlling, by a controller of the storage device, a ratio of number of host read operation to number of read refresh operation in the storage device to be in line with a first value and obtaining a total read request count which accumulates in the storage device;
   (b) when a criterion for updating the ratio is satisfied, in response to a number of read requests, of the total read request count, equaling a threshold value, determining, by the controller, a second value for the ratio of number of host read operation to number of read refresh operation according to the total read request count and information of blocks to be refreshed in the storage device; and
   (c) controlling, by the controller, the number of host read operation and the number of read refresh operation in the storage device so that a ratio of the number of host read operation and the number of read refresh operation is in line with the second value,
   wherein in the step (b), the information of the blocks to be refreshed in the storage device includes a difference value between a read disturb threshold and a read count, an increased read count, and a valid page count for each of the blocks to be refreshed.

2. The method according to claim 1, wherein for each one of the blocks to be refreshed, the controller calculates a ratio of number of host read request and number of pages to be moved for the one of the blocks to be refreshed according to the total read request count and the difference value between the read disturb threshold and the read count, the increased read count, and the valid page count for the one of the blocks to be refreshed during a period that the total read request count accumulates; and the controller determines the second value according to the ratios of numbers of host read request and numbers of pages to be moved for the blocks to be refreshed.

3. The method according to claim 1, wherein the criterion for updating the ratio includes whether a timing value is expired.

4. The method according to claim 1, wherein the criterion for updating the ratio includes whether the total read request count is greater than or equal to a read request threshold.

5. The method according to claim 1, wherein the criterion for updating the ratio includes whether the information of the blocks to be refreshed in the storage device changes.

6. The method according to claim 1, wherein in the step (c), the controller resets the total read request count and starts obtaining a total read request count which accumulates in the storage device again, the method further comprises:
   repeating the step (b) to update the second value, and
   repeating the step (c) according to the updated second value.

7. A storage medium, which stores program instructions that are capable of causing a storage device performing the method for dynamically managing host read operation and read refresh operation in the storage device according to claim 1.

8. A storage device, comprising:
   a plurality of memory chips; and
   a controller, coupled to the plurality of memory chips, wherein the controller is configured to perform a plurality of operations including:
   (a) controlling a ratio of number of host read operation to number of read refresh operation in the storage device to be in line with a first value and obtaining a total read request count which accumulates in the storage device;
   (b) when a criterion for updating the ratio is satisfied, in response to a number of read requests, of the total read request count, equaling a threshold value, determining a second value for the ratio of number of host read operation to number of read refresh operation according to the total read request count and information of blocks to be refreshed in the storage device; and
   (c) controlling the number of host read operation and the number of read refresh operation in the storage device so that a ratio of the number of host read operation and the number of read refresh operation is in line with the second value,
   wherein in the operation (b), the information of the blocks to be refreshed in the storage device includes a difference value between a read disturb threshold and a read count, an increased read count, and a valid page count for each of the blocks to be refreshed.

9. The storage device according to claim 8, wherein for each one of the blocks to be refreshed, the controller calculates a ratio of number of host read request and number of pages to be moved for the one of the blocks to be refreshed according to the total read request count and the difference value between the read disturb threshold and the read count, the increased read count, and the valid page count for the one of the blocks to be refreshed during a period that the total read request count accumulates; and the controller determines the second value according to the ratios of numbers of host read request and numbers of pages to be moved for the blocks to be refreshed.

10. The storage device according to claim 8, wherein the criterion for updating the ratio includes whether a timing value is expired.

11. The storage device according to claim 8, wherein the criterion for updating the ratio includes whether the total read request count is greater than or equal to a read request threshold.

12. The storage device according to claim 8, wherein the criterion for updating the ratio includes whether the information of the blocks to be refreshed in the storage device changes.

13. The storage device according to claim 8, wherein in the operation (c), the controller resets the total read request count and starts obtaining a total read request count which accumulates in the storage device again, the method further comprises:

repeating the operation (b) to update the second value, and repeating the operation (c) according to the updated second value.

* * * * *